United States Patent [19]

Moses, Jr. et al.

[11] Patent Number: 4,972,294
[45] Date of Patent: Nov. 20, 1990

[54] HEAT SINK CLIP ASSEMBLY

[75] Inventors: John A. Moses, Jr., Carol Springs; Joseph A. Budano, II, Plantation, both of Fla.

[73] Assignee: Motorola, Inc., Schaumburg, Ill.

[21] Appl. No.: 332,085

[22] Filed: Apr. 3, 1989

[51] Int. Cl.$^5$ .............................................. H05K 7/20
[52] U.S. Cl. .................................. 361/386; 174/16.3; 165/80.3; 267/160; 267/181
[58] Field of Search .................... 357/79, 81; 165/185, 165/80.2, 80.3; 174/16.3; 361/382, 386–388, 417, 419, 420, 427; 267/158, 160, 164, 181; 24/295, 458, 573, 625

[56] References Cited

U.S. PATENT DOCUMENTS

| | | | |
|---|---|---|---|
| 3,348,148 | 10/1967 | Parsons | 325/15 |
| 3,997,236 | 12/1976 | Bresin | 339/221 |
| 4,552,206 | 11/1985 | Johnson et al. | 165/80.3 |
| 4,575,038 | 3/1986 | Moore | 361/386 |
| 4,674,005 | 6/1987 | Lacz | 174/16.3 |
| 4,707,726 | 11/1987 | Tinder | 174/16.3 |
| 4,710,852 | 12/1987 | Keen | 174/16.3 |
| 4,716,494 | 12/1987 | Bright | 361/386 |
| 4,745,456 | 5/1988 | Clemens | 361/386 |
| 4,752,244 | 6/1988 | Kuhl et al. | 439/635 |
| 4,845,590 | 7/1989 | Mikolajczak | 174/16.3 |

OTHER PUBLICATIONS

Catalog 1100, Part No. E5301 and E5304 p. 33 (Aavid Engineering, Inc. 1985).

*Primary Examiner*—Gerald P. Tolin
*Attorney, Agent, or Firm*—Juliana Agon

[57] ABSTRACT

A heat sink assembly for protecting at least one electronic device is provided which comprises a heat sink and a clip. The clip includes first and second opposed end portions and an interconnecting intermediate portion. The first end portion is pivotally anchored. In order to bias at least one device against the heat sink, the intermediate portion includes at least one spring member resiliently engageable with at least one electronic device. The second end portion removably fastens the clip to the heat sink.

15 Claims, 4 Drawing Sheets

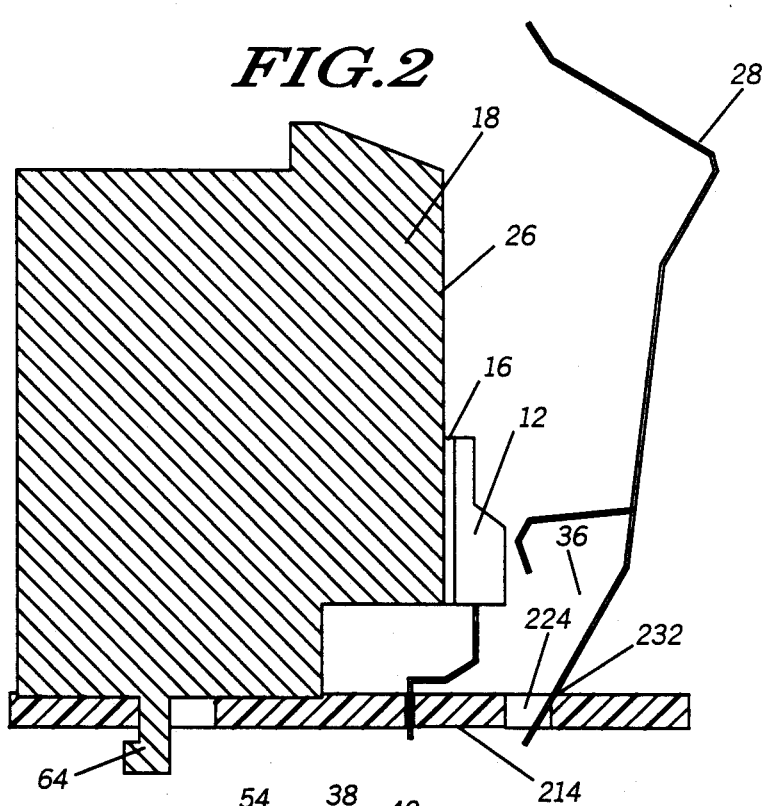
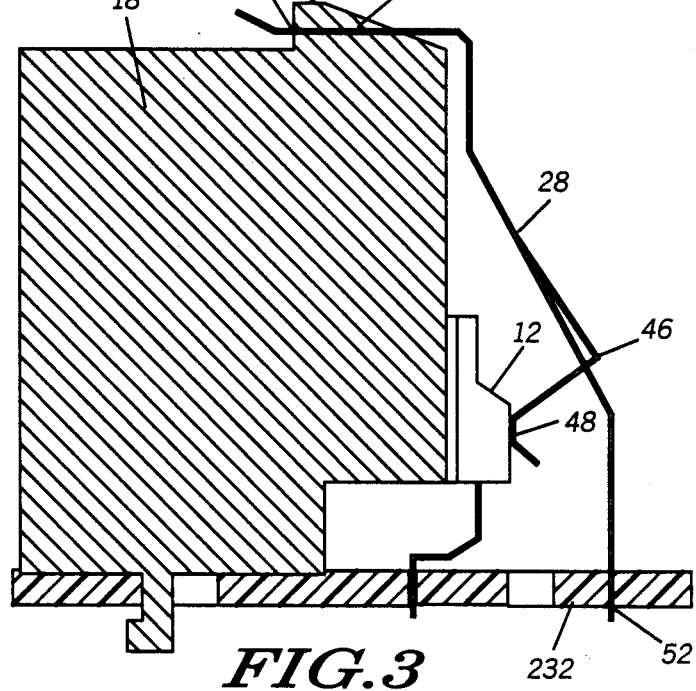

HEAT SINK ASSEMBLY

TECHNICAL FIELD

This invention relates generally to thermal and mechanical contact assemblies and more particularly to a heat sink and casing for protecting electronic devices which requires no special tools for assembly.

BACKGROUND ART

Most mechanical and thermal contact assemblies used in the prior art require additional mounting structures, such as rivets, screws, or other hardware, to attach or assemble the protective casing to the heat sink. The use of these additional mounting structures increases the risks of assembly defects and the material cost of manufacturing contact assemblies, as well as the labor cost.

Moreover, some of the prior art contact assemblies require the use of special tools or a high insertion force to attach the protective casing to the heat sink. One known design uses a spring clip to attach the electonic device to the heat sink. However, this clip requires a high insertion force for installment and in addition, the side installation in reorientation of the parts during assembly which increases assembly time.

During assembly, it is also important not to mechanically damage the device or the device leads. Therefore, the goal is to quickly and reliably attach the device to the heat sink with a sufficient force to retain without damaging the device.

The use of addtional components and special mounting tools not only increases the cost of the finished heat sink assembly but also makes field replacement of the protected underlying electronic device difficult and impractical.

When mounting structures such as screws are used there is always a possibility of the screw becoming loose and causing the electronic device to make an insufficient contact with the heat sink for maximum heat transfer. Thus the reliability of prior thermal and mechanical contact assemblies may depend, not only on the casing itself, but also on the mounting hardware used to attach the casing. Since the reliability of any assembly always decreases as the number of parts in the assembly increases, prior art heat sink assemblies which require additional mounting structures are inherently less reliable.

SUMMARY OF THE INVENTION

Accordingly, it is an object of the present invention to provide a heat sink assembly which can be easily assembled without the use of special tools or unreliable mounting hardware.

Briefly, according to the invention, a heat sink assembly for at least one electronic device is provided which comprises a heat sink and a clip. The clip includes first and second opposed end portions and an interconnecting intermediate portion. The first end portion is pivotally anchored. In order to bias at least one device against the heat sink, the intermediate portion includes at least one spring member resiliently engagable with at least one electronic device. The second end portion removably fastens the clip to the heat sink.

BRIEF DESCRIPTION OF THE DRAWINGS

FIG. 2 is side elevational view of the heat sink assembly of FIG. 1 with a clip being inserted into a PC board.

FIG. 3 is a side elevational view of the heat sink assembly of FIG. 1 fully assembled.

DETAILED DESCRIPTION OF THE PREFERRED EMBODIMENT

Figure 1:
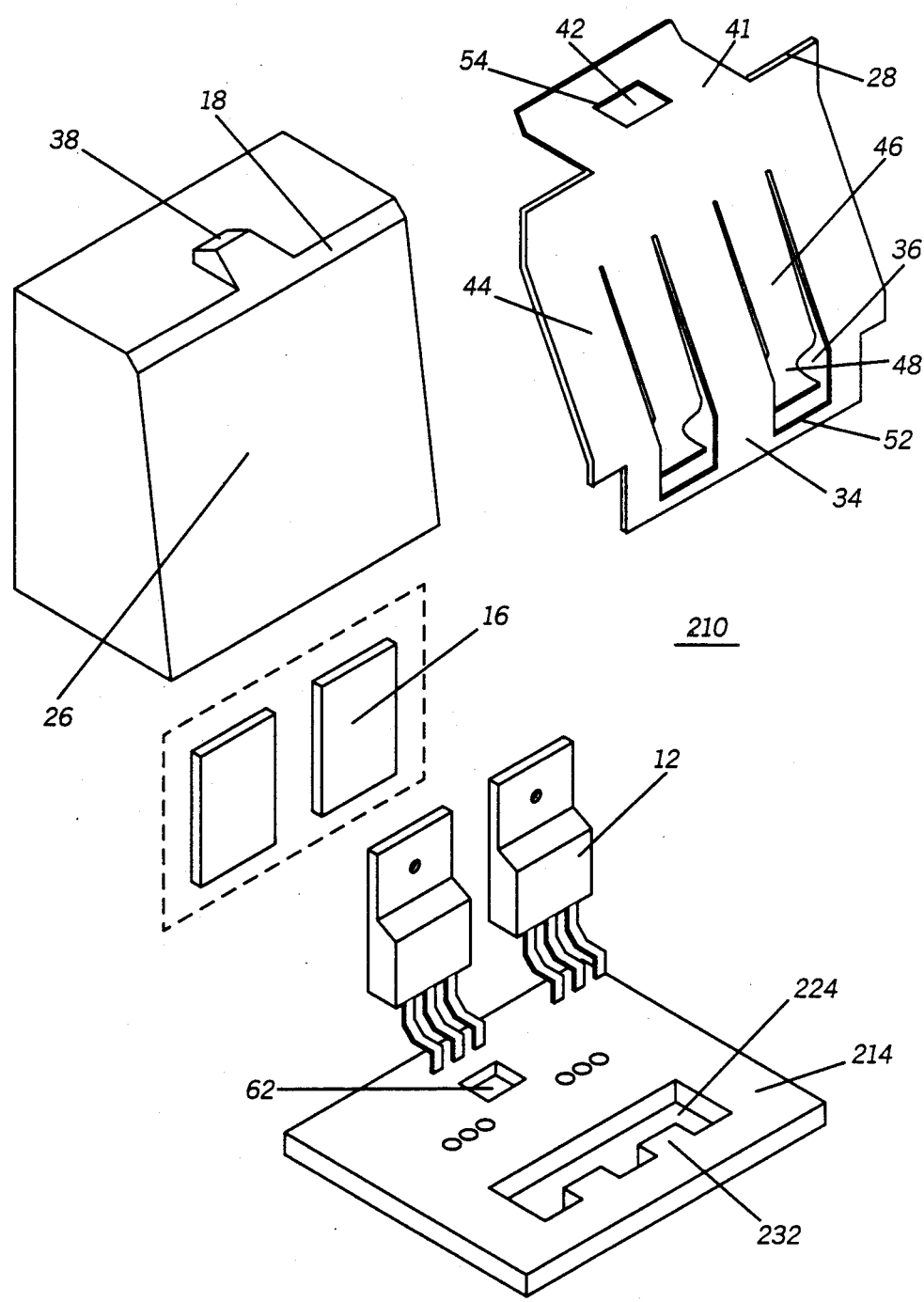
FIG. 1 is an exploded perspective view of a heat sink assembly preferably embodying the present invention.

Referring to FIG. 1, a preferred embodiment of a heat sink assembly 210 is shown ready for assembly. The heat sink assembly 210 is utilized to protect at least one heat dissipating device such as 12 which is connected (as by soldering) to a PC board 214 which comprises supporting means. The invention contemplates protecting one or more electronic devices. The preferred embodiments are designed to protect two devices, for clarity the protection of only one is described.

The heat dissipating device 12 may be an electronic device such as a transistor or a power amplifier. The PC board 214 mates with a heatsink 18 such that the electronic device 12 stands alongside a wall 26 of the heat sink 18. For anchoring the heat sink to the PC board, the PC board 214 has at least one opening 62 for receiving a tab 64 (shown in FIG. 2) of the heat sink 18. As shown in FIG. 1, depending on circuit requirement, an optional insulator 16 may be placed between the electronic device 12 and the heat sink 18. A clip 28 is placed over the electronic device 12 and attaches to both the PC board 214 and the heat sink 18, for mechanically biasing the electronic device 12 against the heat sink wall 26.

For attaching the clip 28 to the PC board 214, the PC board 214 has at least one and in the preferred embodiment two protrusions 232, which comprise anchoring means. The protrusion 232 extends into an opening 224. The protrusions can be rectangular, wedge-like, or in any other suitable shape. The clip 28 includes a first opposed end portion 34 having openings 36 for receiving the protrusions 232 of the PC board 214.

On the other end, the clip 28 includes a second opposed end portion 41 having an opening 42. The clip 28 is removably attached to the heat sink 18 at a wedge-like projection 38, with the projection 38 and opening 42 comprising fastening means. Operationally, the clip 28 is retained by engagement of an opening edge 52 of the opening 36 with the protrusions 232, and engagement of an opening edge 54 of the opening 42 with the wedge 38.

An intermediate portion 44 of clip 28 interconnects the first end portion 34 and the second end portion 41. Spring fingers 46 are formed from the opening 36 of the intermediate portion 44. The spring fingers 46 are curled on their free ends to form an engagement surface 48 for contacting the electronic device 12. The distance from the opening edge 54 to the opening edge 52 is greater than the distance from the engagement surface 48 to the opening edge 52 to provide the desired leverage of the clip 28. (See also FIG. 3).

Referring to FIG. 2, the insertion of the clip 28 is illustrated in a side view. As shown, the electronic device 12 is soldered on to a PC board 214 and rests against the heat sink wall 26 of the heatsink 18 with an optional insulator 16 between the electronic device 12 and the heat sink wall 26. With no insertion force, the clip 28 is inserted downwardly into the opening 224 cut out from the PC board 214. The clip 28 is pivotally anchored by slipping the opening 36 over the protrusion 232.

Referring to FIG. 3, a side view of the fully assembled heat sink assembly of the preferred embodiment is shown. As the clip 28 shown in FIG. 2 is pressed towards the heat sink 18, the curved engagement surface 48 of the spring finger 46 presses against the electronic device 12. As the opening edge 52 is pivotally anchored to the protrusions 232 of the PC board 214 and the opening 42 slides over the projection 38 of the heat sink 18, the loading force created by pressing the clip 28 towards the heat sink 18 translates to a much greater clamping force. When the opening edge 54 is finally retained by the projection 38 of the heatsink 18, the spring finger 46 clamps the electronic device 12 to the heatsink wall 26 of the heat sink 18 as desired.

Figure 4:
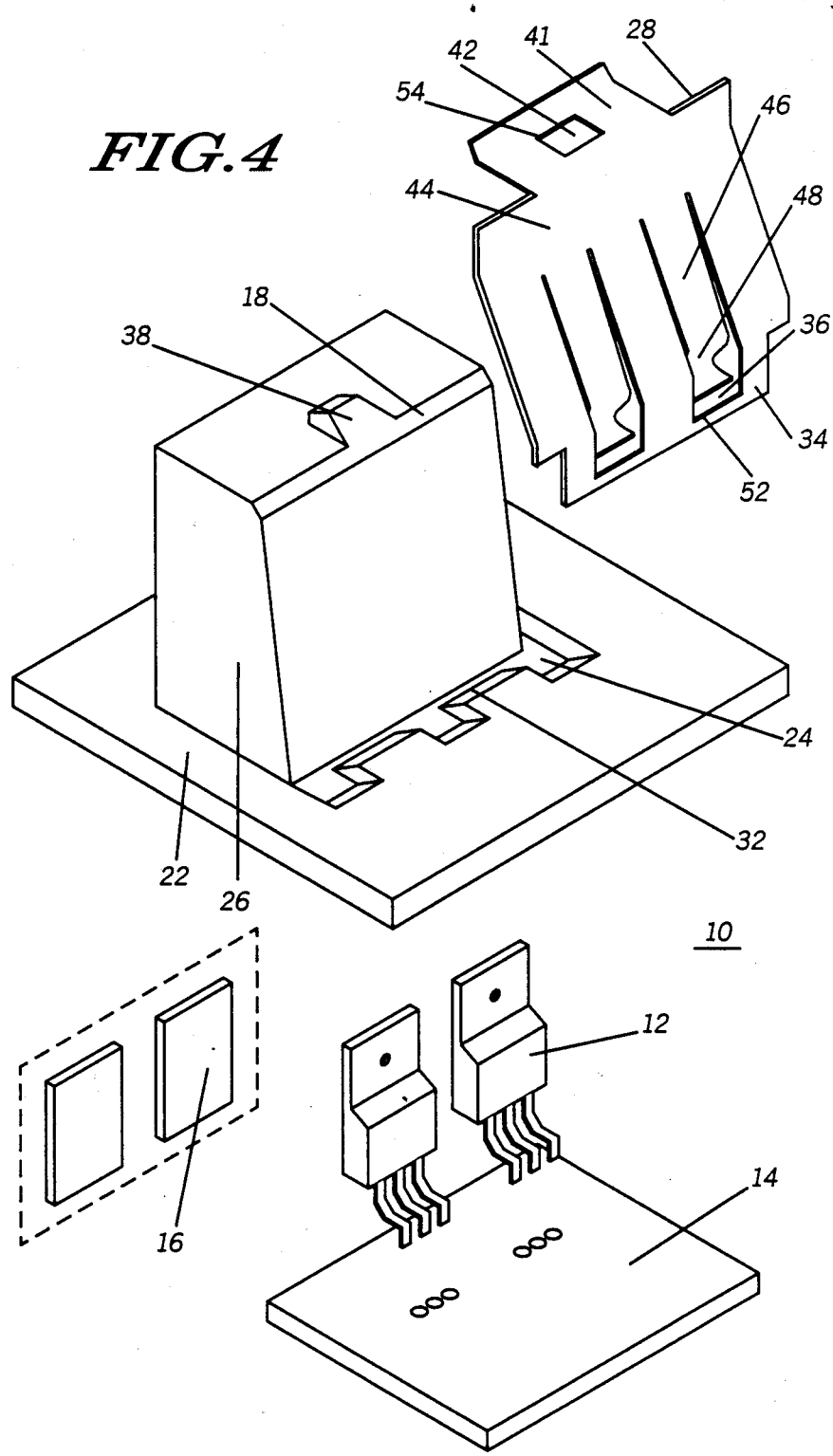
FIG. 4 is an exploded perspective view of a heat sink assembly alternately embodying the present invention.

Referring to FIG. 4, an alternate embodiment of a heat sink assembly 10 is shown. A metal casing or chassis 22, which comprises supporting means, is integrally connected to or formed with (as by molding) the heat sink 18. The chassis 22 includes an opening 24 which is placed over the electronic device 12 such that the electronic device 12 protrudes through the opening 24 and stands alongside the wall 26 of the heat sink 18. Depending on circuit requirement, the optional insulator 16 may be placed between the electronic device 12 and the heatsink wall 26 of the heat sink 18. The clip 28 is placed over the electronic device 12 and attaches to both the chassis 22 and the heat sink 18, for biasing the electronic device 12 against the heat sink wall 26.

For attaching the clip 28 to the chassis 22, the chassis 22 has at least one and in the alternate embodiment two wedge-like protrusions 32, which comprise anchoring means. The protrusion 32 extends into the opening 24. The clip 28 includes the first opposed end portion 34 having openings 36 for receiving the protrusions 32 of the chassis 22.

On the other end, the clip 28 includes the second opposed end portion 41 having the opening 42. The clip 28 removably attached to the heat sink 18 at the wedge-like projection 38, with the projection 38 and opening 42 comprising fastening means. Operationally, the clip 28 is retained by engagement of the opening edge 52 of the opening 36 with the protrusions 32 and engagement of the opening edge 54 of the opening 42 with the wedge 38.

The intermediate portion 44 of clip 28 interconnects the first end portion 34 and the second end portion 41. Spring fingers 46 are formed from the opening 36 of the intermediate portion 44. The spring fingers 46 are curled on their free ends to form the engagement surface 48 for contacting the electronic device 12. The distance from the opening edge 54 to the opening edge 52 is greater than the distance from the engagement surface 48 to the opening edge 52 to provide the desired leverage of the clip 28.

Figure 5:
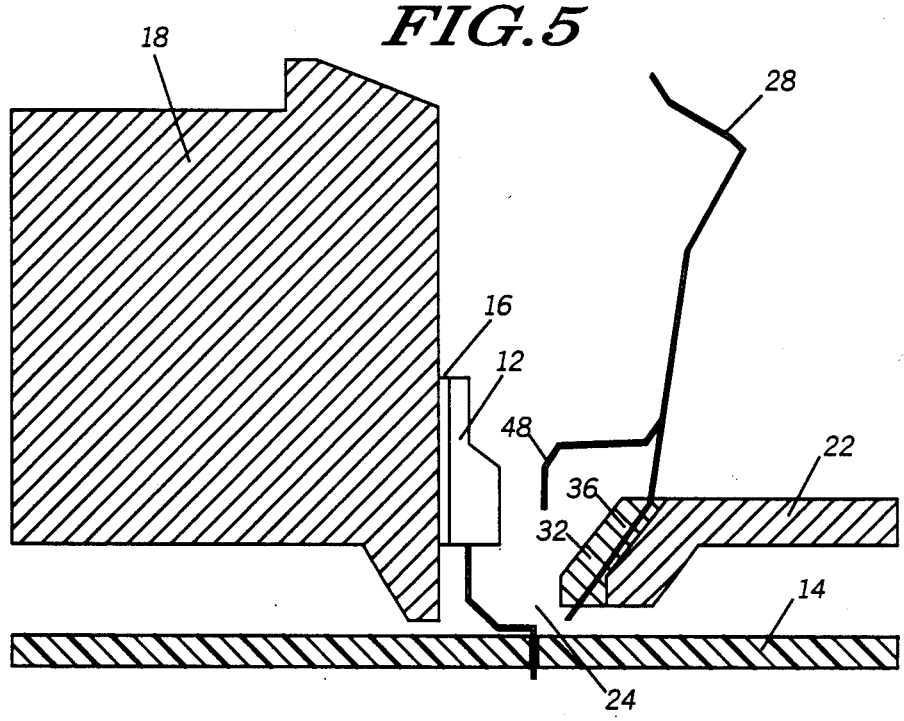
FIG. 5 is a side elevational view of the heat sink assembly of FIG. 4 with a clip being inserted into a chassis.

Referring to FIG. 5, the insertion of the clip 28 is illustrated in a side view of the alternate embodiment. As shown, the electronic device 12 is soldered on to the PC board 14 and rests against the heatsink wall 26 of the heat sink 18 with the optional insulator 16 between the electronic device 12 and the heatsink wall 26. With no insertion force, the clip 28 inserted downwardly into the opening 24 cut out from the chassis 22. The clip 28 is pivotally anchored by slipping the opening 36 over the protrusion 32.

Figure 6:
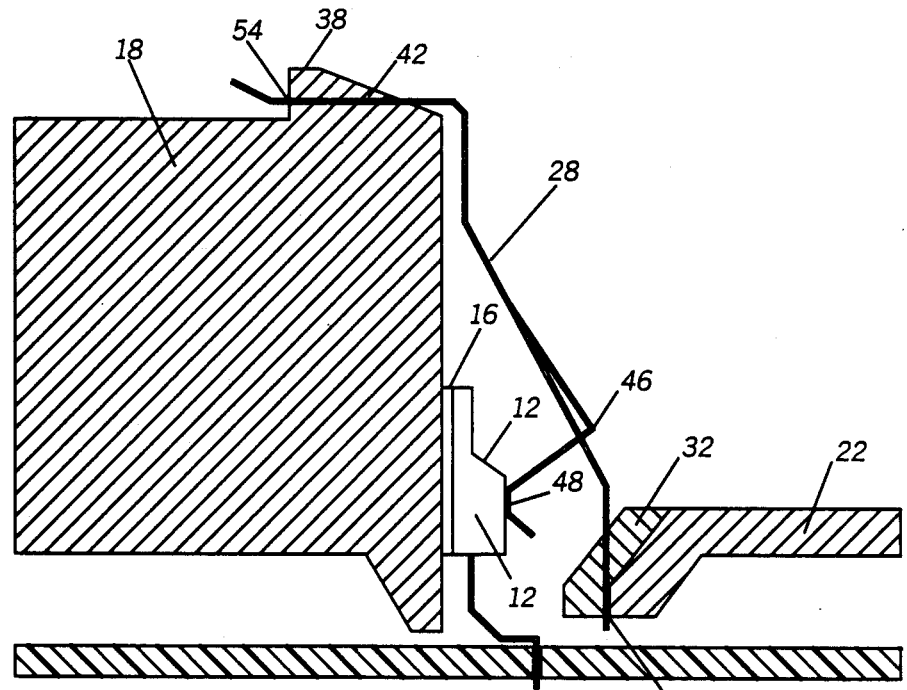
FIG. 6 is a side elevational view of the heat sink assembly of FIG. 4 fully assembled.

Referring to FIG. 6, a side view of the fully assembled heat sink assembly of the alternate embodiment is shown. As the clip 28 shown in FIG. 5 is pressed towards the heat sink 18, the curved engagement surface 48 of the spring finger 46 presses against the electronic device 12. As the opening edge 52 is pivotally anchored to the protrusion 32 of the chasses 22 and the opening 42 slides over the projection 38 of the heat sink 18, the loading force created by pressing the clip 28 towards the heat sink 18 translates to a much greater clamping force. When the opening edge 54 is finally retained by the projection 38 of the heat sink 18, the spring finger 46 clamps the electronic device 12 to the heatsink wall 26 of the heat sink 18 as desired.

What is claimed is:

1. A heat sink assembly for at least one electronic device, comprising:
   a heat sink;
   supporting means supporting said heat sink; and
   a clip including first and second opposed end portions and an interconnecting intermediate portion, said first end portion being pivotally anchored to said supporting means;
   said intermediate portion including at least one spring member resiliently removably engaged with said at least one electronic device for biasing said at least one device against said heat sink; and
   said second end portion removably fastening said clip directly to said heat sink.

2. A heat sink assembly for at least one electronic device, comprising:
   a heat sink for operatively supporting said at least one electronic device and including fastening means;
   supporting means supporting said heat sink and including anchoring means;
   a clip including first and second opposed end portions and an interconnecting intermediate portion, said first end portion being pivotaly anchored to said anchoring means of said supporting means;
   said intermediate portion including at least one spring member resiliently removably engaged with said at least one electronic device for biasing said at least one device against said heat sink; and
   said second end portion removably fastening said clip directly to said fastening means of said heat sink.

3. The heat sink assembly of claim 2 wherein:
   said fastening means of said heat sink comprises a projection; and
   said second end portion of said clip includes an opening receiving said projection of said heat sink.

4. The heat sink assembly of claim 2 wherein said supporting means includes an opening for receiving said at least one electronic device.

5. The heat sink assembly of claim 2 wherein said at least one spring member of said clip comprises a resilient finger formed in said intermediate portion.

6. The heat sink assembly of claim 5 wherein said resilient finger includes an engagement surface for biasing said electronic device.

7. The heat sink assembly of claim 6 wherein said engagement surface of said clip is located closed to said first end portion than to said second end portion.

8. The heat sink assembly of claim 2 wherein said supporting means comprises a chassis.

9. The heat sink assembly of claim 4 wherein said chassis is metallic.

10. The heat sink assembly of claim 9 wherein said chassis and said heat sink are integrally formed.

11. The heat sink assembly of claim 9 wherein said chassis and said heat sink are integrally connected.

12. The heat sink assembly of claim 9 wherein:
said anchoring means of said chassis comprises at least one protrusion; and
said first end portion of said clip includes at least one opening for receiving said at least one protrusion of said chassis.

13. The heat sink assembly of claim 2 wherein said supporting means comprises a printed circuit board.

14. The heat sink assembly of claim 13 wherein:
said anchoring means of said printed circuit board comprises at least one protrusion; and
said first end portion of said clip includes at least one opening receiving said at least one protrusion of said printed circuit board.

15. A heat sink assembly for two electronic devices, comprising:
a heat sink;
supporting means supporting said heat sink; and
a clip including first and second opposed end portions and an interconnecting intermediate portion, said first end portion being pivotally anchored to said supporting means;
said intermediate portion including two spring members each being resiliently removably engaged with an associated one of said two electronic devices for biasing the devices against said heat sink; and
said second end portion removably fastening said clip directly to said heat sink.

* * * * *